(12) United States Patent
Pirillis

(10) Patent No.: US 8,339,784 B2
(45) Date of Patent: Dec. 25, 2012

(54) THERMAL MANAGEMENT FOR ELECTRONIC DEVICE HOUSING

(75) Inventor: Alexandros Pirillis, Skokie, IL (US)

(73) Assignee: Methode Electronics, Inc., Chicago, IL (US)

( * ) Notice: Subject to any disclaimer, the term of this patent is extended or adjusted under 35 U.S.C. 154(b) by 250 days.

(21) Appl. No.: 12/683,093

(22) Filed: Jan. 6, 2010

(65) Prior Publication Data

US 2011/0164382 A1    Jul. 7, 2011

(51) Int. Cl.
*H05K 7/20* (2006.01)
*H05K 5/02* (2006.01)

(52) U.S. Cl. ............... 361/692; 361/690; 361/679.5; 361/679.51

(58) Field of Classification Search ............ 361/690, 361/692, 679.5, 679.51
See application file for complete search history.

(56) References Cited

U.S. PATENT DOCUMENTS

| | | | | |
|---|---|---|---|---|
| 4,365,288 A * | 12/1982 | Robe et al. | ........... | 363/141 |
| 5,204,497 A | 4/1993 | Herrick | | |
| 5,563,768 A * | 10/1996 | Perdue | ........... | 361/695 |
| 5,762,550 A | 6/1998 | Brunner | | |
| 5,969,942 A * | 10/1999 | Heckner et al. | ........... | 361/695 |
| 6,081,425 A | 6/2000 | Cheng | | |
| 6,443,768 B1 * | 9/2002 | Dirkers et al. | ........... | 439/607.2 |
| 6,508,595 B1 | 1/2003 | Chan et al. | | |
| 6,508,704 B1 * | 1/2003 | Wilson | ........... | 454/277 |
| 6,558,191 B2 * | 5/2003 | Bright et al. | ........... | 439/541.5 |
| 6,666,720 B1 * | 12/2003 | Reisinger et al. | ........ | 439/607.13 |
| 6,729,905 B1 * | 5/2004 | Hwang | ............ | 439/607.21 |
| 6,731,519 B1 * | 5/2004 | Hwang | ............ | 361/818 |
| 6,814,659 B2 * | 11/2004 | Cigelske, Jr. | ........... | 454/184 |
| 6,816,376 B2 | 11/2004 | Bright et al. | | |
| 6,896,043 B2 * | 5/2005 | Dunn | ............. | 165/165 |
| 6,932,443 B1 * | 8/2005 | Kaplan et al. | ........... | 312/213 |
| 6,943,287 B2 * | 9/2005 | Lloyd et al. | ........... | 174/359 |
| 6,980,437 B2 | 12/2005 | Bright | | |
| 7,044,777 B1 * | 5/2006 | Daly et al. | ........... | 439/540.1 |
| 7,238,104 B1 * | 7/2007 | Greenslade et al. | ...... | 454/184 |
| 7,352,582 B2 * | 4/2008 | Yokoyama | ........... | 361/703 |
| 7,355,857 B2 | 4/2008 | Pirillis et al. | | |
| 7,371,965 B2 | 5/2008 | Ice | | |
| 7,452,216 B2 * | 11/2008 | Murr et al. | ........... | 439/74 |
| 2001/0001529 A1 * | 5/2001 | Behl et al. | ........... | 312/223.1 |
| 2001/0004313 A1 * | 6/2001 | Yamaoka | ........... | 361/704 |
| 2002/0055329 A1 * | 5/2002 | Storck et al. | ........... | 454/186 |
| 2002/0145856 A1 * | 10/2002 | Jones et al. | ........... | 361/752 |
| 2002/0173265 A1 * | 11/2002 | Kipka et al. | ........... | 454/184 |
| 2003/0085025 A1 * | 5/2003 | Woods et al. | ........... | 165/104.33 |

(Continued)

FOREIGN PATENT DOCUMENTS

JP    03297198 A   * 12/1991

*Primary Examiner* — Anatoly Vortman
(74) *Attorney, Agent, or Firm* — Arnstein & Lehr LLP

(57) ABSTRACT

The present invention pertains to a cage for thermal management and housing an electric module comprising a cage housing and having a top, bottom and side walls joined to form an interior cavity and the side walls defining a width of the interior cavity. The top wall may have an air inlet port and an air outlet port and the air inlet and outlet ports spaced apart by a length. The length may be most or all of the width, so that air entering the inlet port will travel over a portion of a side of an electronic module mounted in the cavity prior to exiting the outlet port.

19 Claims, 2 Drawing Sheets

U.S. PATENT DOCUMENTS

| | | | |
|---|---|---|---|
| 2003/0114099 A1* | 6/2003 | Voorhies | 454/184 |
| 2003/0141090 A1 | 7/2003 | Kruger et al. | |
| 2003/0156385 A1* | 8/2003 | Askeland et al. | 361/687 |
| 2003/0210523 A1* | 11/2003 | Tuttle et al. | 361/687 |
| 2004/0075993 A1* | 4/2004 | Hwang | 361/818 |
| 2004/0077217 A1* | 4/2004 | Hwang | 439/607 |
| 2004/0090743 A1* | 5/2004 | Chuang et al. | 361/695 |
| 2004/0217072 A1* | 11/2004 | Bash et al. | 211/26 |
| 2005/0208831 A1* | 9/2005 | Lee | 439/608 |
| 2006/0003632 A1* | 1/2006 | Long | 439/608 |
| 2006/0082973 A1* | 4/2006 | Egbert et al. | 361/709 |
| 2006/0086485 A1* | 4/2006 | Meadowcroft et al. | 165/122 |
| 2007/0097604 A1* | 5/2007 | Bruski et al. | 361/605 |
| 2007/0183128 A1* | 8/2007 | Pirillis et al. | 361/715 |
| 2008/0102699 A1* | 5/2008 | Chen | 439/607 |
| 2008/0242127 A1* | 10/2008 | Murr et al. | 439/79 |
| 2009/0084530 A1 | 4/2009 | Shuy | |
| 2009/0176409 A1* | 7/2009 | Oki | 439/607.2 |
| 2009/0244856 A1* | 10/2009 | Pirillis | 361/747 |
| 2010/0151733 A1* | 6/2010 | Tsou | 439/607.55 |
| 2011/0053415 A1* | 3/2011 | Fonteneau et al. | 439/607.01 |

* cited by examiner

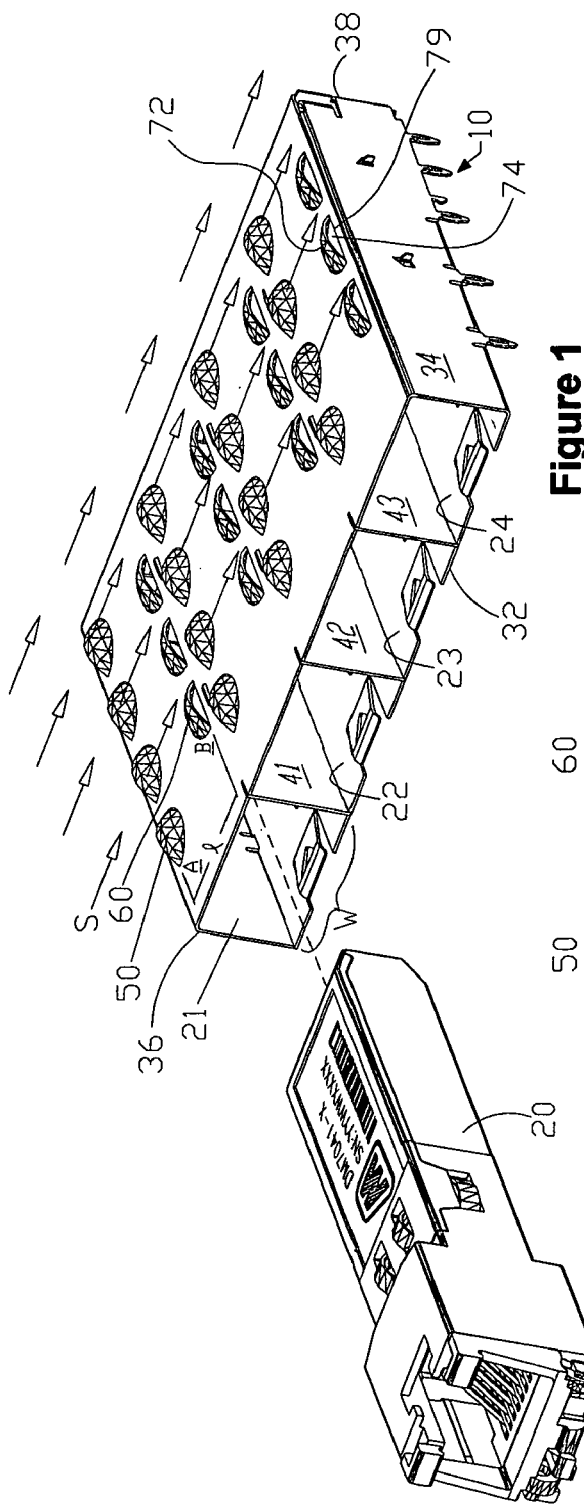
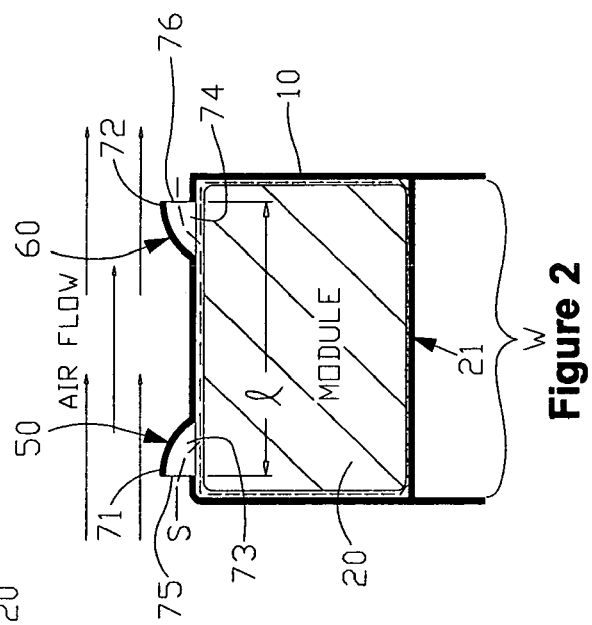
Figure 1
Figure 2

THERMAL MANAGEMENT FOR ELECTRONIC DEVICE HOUSING

The present invention pertains to a thermal management system for an electronic device housing including a cage having air flow management construction.

BACKGROUND

Thermal management of electronic devices has given rise to many components to deal with heat issues. For example heat sinks are well known for drawing heat away from electronic components such as a microprocessor. Heat sinks make physical contact with a heat developing device. The heat sink may have posts or fins that are elevated to make contact with the air flow above the heat generating device. Air flow removes heat from the posts or rigs. However, such heat sinks do not bring air down to the heat developing device. Also, heat sinks do not make 100% contact with the entire surface of the heat developing device due to imperfections in the flatness of the bottom of the heat sink, imperfections in the flatness of the heat developing device, non-conduction or poor rate of heat transfer due to interfering objects such as recesses or labels. In addition, a heat sink only affects the top surface of the heat developing device upon which the heat sink is mounted. Also, when there are multiple heat developing devices, there in turn need to be multiple heat sinks attached to such devices which may require excessive assembly time and expense. In order to overcome the disadvantages above, applicant has developed the present invention.

SUMMARY

The present invention pertains to a cage for thermal management and housing an electric module comprising a cage housing and having a top, bottom and side walls joined to form an interior cavity and the side walls defining a width of the interior cavity. The top wall may have an air inlet port and an air outlet port and the air inlet and outlet ports spaced apart by a length. The length may be at least 10% of the width, so that air entering the inlet port will travel over a portion of a side of an electronic module mounted in the cavity prior to exiting the outlet port.

The inlet port may include a canopy protruding beyond the top wall to deflect air flowing across the top wall into the interior cavity of the cage. In an embodiment, the canopy may have an arcuate shape. In an embodiment, the canopy may form a half dome.

In an embodiment, the inlet port may include an inlet hole and the canopy may enclose a majority of the hole. In an embodiment, the canopy inlet hole is semi-circular in shape and includes a linear side across the diameter of the hole and the canopy enclosing about 180 degrees of the hole on an arcuate side of the hole and providing an opening across the linear side, so that a cross section of canopy forming the opening is a semi-circle.

In an embodiment, the cage may include multiple cavities for receiving multiple electronic modules on the top wall enclosing multiple cavities and a plurality of inlet and outlet ports formed on the top wall to provide air circulation within the multiple cavities. In an embodiment, the canopy inlet and outlet ports are arranged in a staggered orientation on the top wall so that the adjacent ports do not obstruct the airflow into the adjacent inlet port. In an embodiment, an even number of inlet ports are arranged linearly across the top wall and each inlet port adjacent a first side wall and an odd number of outlet ports are arranged linearly across the top wall and each outlet port adjacent a second side wall. In an embodiment, four inlet ports and three outlet ports are arranged linearly in two rows across the top wall.

In an embodiment, the outlet port includes a canopy protruding across the top wall and the canopy forming an opening to direct exhaust out of the interior cavity. In an embodiment, the canopy of the inlet port includes an opening facing in a direction opposite the opening provided by the canopy of the outlet port, so that a stream of air flowing in one direction can enter the inlet port and exit the outlet port. In an embodiment, the opening of the canopy inlet port is oriented to intercept a stream of air flowing parallel to the side walls. In an embodiment, the opening of the canopy of the inlet port is oriented to intercept a stream of air flowing perpendicular to the side walls. In an embodiment, the opening of the canopy of the inlet port is oriented to intercept a stream of air flowing oblique to the side walls.

In an embodiment, the length between the inlet and outlet port is substantially equal to the width, so that air entering the inlet port will travel over a substantial portion of the side of the electronic module mounted in the cavity prior to exiting the outlet port. In an embodiment, the air deflected by the canopy develops turbulence in order to cause air flow in the cavity on at least two sides of an electronic module residing in the cavity.

BRIEF DESCRIPTION OF THE DRAWINGS

The invention is described through a preferred embodiment in the attached drawings in which:

FIG. 1 depicts a perspective view of the present invention in an embodiment, having a ganged group of cages;

FIG. 2 depicts a side elevation cut-away view of an embodiment of the present invention depicting a single cage;

DETAILED DESCRIPTION

Figure 3:
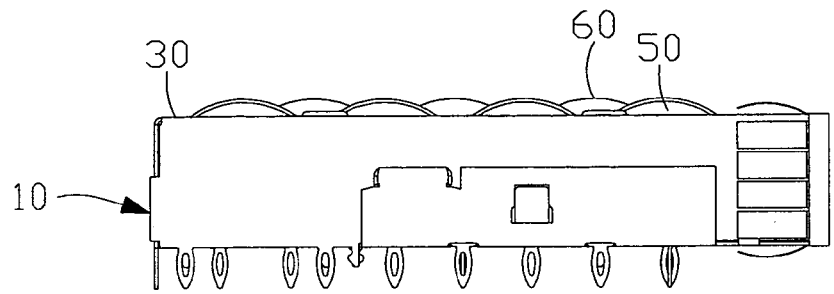
FIG. 3 depicts a side elevation view of the invention of FIG. 1.

The present invention provides for thermal management of electronic device housing and particular embodiments of such invention are described with respect to drawing FIGS. 1-5 as follows:

In an embodiment, a cage 10 is provided having a ganged construction for receiving an electronic module 20 received in a first interior cavity 21. The ganged cage 10 also includes a second interior cavity 22, third interior cavity 23 and fourth interior cavity 24. Each of the cavities 21, 22, 23, 24 may receive an electronic module 20 in a ganged orientation. In a preferred embodiment the caged housing 10 is stamped of metal and includes a top wall 30, a bottom wall 32, side walls 34, 36, back wall 38 and divider walls 41, 42 and 43. The top wall provides a first panel 30 formed of a single metal sheet covering each of the four cavities 21, 22, 23, 24. The metal planer first panel 30 has at least one stamped air inlet port 50 and air outlet ports 60.

In the embodiment depicted in FIG. 1 a plurality of air inlet ports 50 are aligned in a row A adjacent side wall 36 and a plurality of air outlet ports 60 are aligned in a row B, adjacent a divider/side wall 41. The walls 36 and 41 define a width W of the cavity 21. It can be seen that the rows of ports A and B are arranged so that the ports 50, 60 (scoops) are as far to the edges of the cavity 21 as possible and adjacent each wall 36, 41 as possible. Each port 50, 60 is separated by a length 1. In an embodiment, the length 1 is from 10% to 100% of the width W. The air stream (moving from the left side of FIG. 1 to the right) enters inlet port 50 and is received within the interior cavity 21. Due to the large length L and wide spacing between corresponding ports 50, 60, the air stream will travel through the majority of the cavity 21 and exit at outlet port 60. In this way it may be understood that the greatest amount of cooling of the module 20 mounted within the cavity 21 will be accomplished when the length L is greatest and the greatest volume of air may interact with the module 20. In other words, when the inlet port 50 is adjacent sidewall 21 and outlet port 60 is adjacent sidewall 41 the air stream S can flow across the majority of the top surface of the module 20.

Similarly, for FIG. 2 where a single cage 10 is shown housing a single module 20 it can be seen that the length L separating inlet port 50 and outlet port 60 is maximized to be close to the width W. In this way, the air stream S may travel across a substantial portion of the top surface of the module 20 in order to cool the module to the greatest degree.

Returning the FIG. 1 it can be seen that the Row A of inlet ports 50 is oriented in a staggered orientation with respect Row B of the outlet ports 60. Likewise turning to FIG. 3 and FIG. 4, the staggered orientation of these inlet and outlet ports is depicted. As shown the inlet port 50 is offset from outlet port 60. In this way the air flowing over the top of the first panel 30 will have less of an obstruction due to the offset air ports. For example, turning to FIG. 4, the air stream S1 will enter inlet port 50a and it will continue as air stream S2 and will enter inlet port 50c which will feed air into the adjacent interior cavity 22. Since the outlet port 60 is staggered and is not oriented in front of inlet port 50c, the air steam S2 can more easily enter the inlet port 50c in order to feed more air into the cavity 22. Thus, it can be seen the air stream S1 will continue across the top of the first panel 30 and reach the next inlet port 50e feeding cavity 23 and continue into inlet port 50g in order to enter into cavity 24.

As shown in FIG. 2, each port 50, 60 includes a canopy 71, 72, an inlet hole 73, 74 and an opening 75, 76. With respect to inlet port 50, the air stream S approaches the opening 75 and is deflected and intercepted by the canopy 71, so that the air stream S flows through inlet hole 73 and is received within the cavity 21. Part of the air stream runs along the top of the module 20 (mounted within the cavity 21) and is exhausted through outlet hole 74. The air stream S is intercepted and deflected by canopy 72 and exits opening 76. As is depicted in FIG. 2, some the air stream S will be deflected downward into the cavity 21 and circulate around the sides of the module 20.

Figure 4:
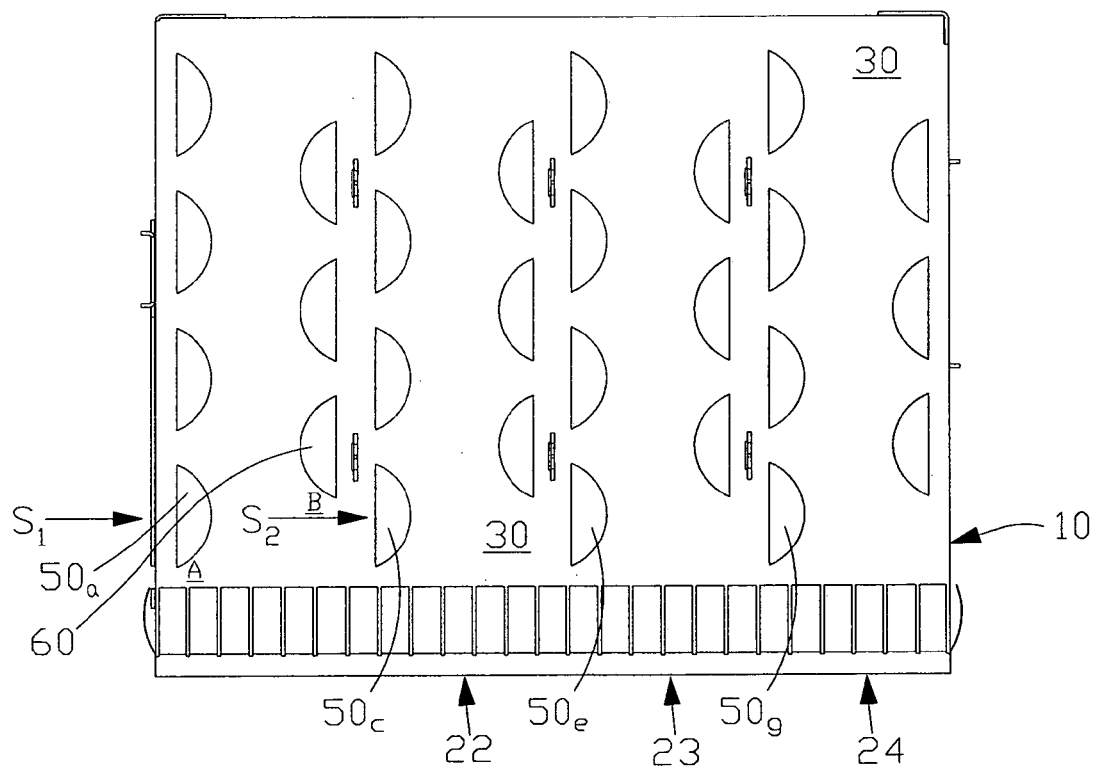
FIG. 4 depicts a plan view of the invention depicted in FIG. 1.

In an embodiment, as depicted in the FIGS. 1-5, the canopy 71 is an arcuate shape and forms a half dome. In an embodiment, the canopy 71 encloses a majority of the inlet hole 73. The canopy 72 encloses a majority of the outlet hole 74. In an embodiment, the inlet and outlet holes 73, 74 are semi-circular in shape and include a linear side 79 (FIG. 1). The canopy 72 enclosing about 180 degrees of the hole on an arcuate side of the hole 74. There is an opening 76 across the linear side 79, so that a cross section of the canopy 72 forming the opening 76 is a semi-circle. In a preferred embodiment, the canopy 72 is stamped out of the metal planner first panel 30 in order to form an air deflector 71, 72 to intercept air traveling along the top of the cage 30. As shown in FIGS. 1 and 4 a plurality of inlet and outlet ports 50, 60 have canopies 71, 72 integrally formed with the first panel 30 of the cage 10. Such stamping provides for an easily manufactured housing that provides for substantial air flow within the cavities 21, 22, 23, 24.

In the ganged construction shown in FIG. 1 and FIG. 4 there are an even number of inlet ports 50 arranged linearly in a Row A across the top wall and an odd number of outlet port 60 arranged linearly in Row B across the top wall 30. As shown there are depicted four inlet ports 50 in Row A and three outlet ports 60 in Row B. However, it may be understood that the size or shape of ports 50, 60 may be altered so that there are more or less of the outlet ports in each row A, B. In an embodiment, the inlet port 50 includes an opening 75 (shown in FIG. 2) that is facing in a direction opposite the opening 76 provided by the outlet port 60 so that air flowing in air stream as flowing in the direction from left to right across FIG. 2 can enter the inlet port 50 and exit the outlet port 60, without changing direction. It may be understood that an air stream S flowing in the opposite direction (as shown in FIG. 2) may also be accommodated by the ports depicted therein. In such an instance, the port 60 would be designated the inlet port and port 50 would be designated the outlet port.

In an alternate embodiment the inlet and outlet ports 50, 60 may be arranged so that an air stream S that is flowing parallel to the side walls 21, 34 is intercepted by the opening 75 of the inlet port 50. In other words, the inlet and outlet ports 50, 60 will be rotated 90 degrees from that which is shown in FIG. 1, where the air stream travels perpendicular to the side walls 21, 34. In a further alternate embodiment the inlet and outlet ports 50, 60 will be oriented to intercept a stream of air that is flowing oblique to the side walls 21, 34.

Figure 5:
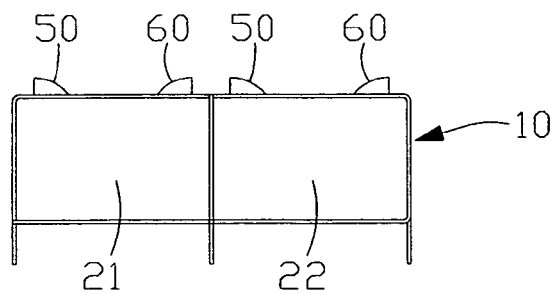
FIG. 5 depicts a schematic view of an alternate embodiment of the present invention having a pair of ganged cages.

As depicted in FIG. 5, cage 10 is depicted having a pair of cavities 21, 22 for receiving a pair of transceiver modules. However, the cage 10 will be constructed as discussed above having an inlet port 50 and an outlet port 60 operating for each cavity 21, 22. Thus, it may be understood that the present invention provides for thermal management of a cage for receiving an electronic module when the cage has a single cavity therein or any number of cavities. In an alternate embodiment, a single large inlet port 50 and outlet port 60 may be provided for a single interior cavity in order to allow for air flow into and out of the cavity 21. In this way it may be understood that the module mounted therein may be cooled in an efficient manner. The inlet and outlet ports 50, 60 or air scoops act in a directional manner to grab air and direct it into the cavity so that air may flow in one direction over the transceiver module mounted within the cavity. In this way a stream of cold air enters the inlet port 50 and hot air is exhausted separately out of the outlet port 60. In an embodiment, the inlet and outlet ports 50, 60 are formed as part of the housing 10 and no extra components are required.

Those of skill in the appropriate art will understand that a number of alternative embodiments of the present invention exist. The above description only provides particular embodiments and one in the skill of the art will understand that additional means of implementing the present invention understands that there are additional means of implementing the present invention.

What is claimed is:
1. A cage for thermal management and housing a removable electronic module comprising:
 a cage housing having top, bottom and side walls joined to form an interior cavity and the walls defining an aperture capable of receiving a removable electronic module for insertion and removal in and out of the interior of the cavity, the top wall defining a plane and the cage orientable so that a stream of air traveling in a first direction flows along the plane and across the top wall of the cage;
 the top wall having an air inlet port and an air outlet port and the inlet and outlet ports disposed in the plane and spaced apart by a length, the inlet port oriented for receiving air entering the inlet port to travel over a por- tion of a side of the removable electronic module mountable in the cavity prior to the air exiting the outlet port;

the inlet port and outlet port each include a canopy protruding beyond the top wall to deflect air flowing across the top wall into the interior cavity of the cage, the air inlet port canopy forming a first air intake opening oriented for receiving air traveling in a first direction through the first air intake opening and through the air inlet port; and the air outlet port canopy forming a first air exit opening for allowing air traveling in the first direction to exit through the outlet port and through the first air exit opening.

2. The cage of claim 1 wherein the canopy has an arcuate shape.

3. The cage of claim 1 wherein the canopy forms a half dome.

4. The cage of claim 1 wherein the inlet port includes an inlet hole and the canopy encloses a majority of the hole.

5. The cage of claim 4 where in the canopy inlet hole is semi-circular in shape and includes a linear side across the diameter of the hole and the canopy enclosing about 180° of the hole on an arcuate side of the hole and providing an opening across the linear side, so that a cross-section of the canopy forming the opening is a semi-circle.

6. The cage of claim 1 wherein the cage includes multiple cavities for receiving multiple electronic modules and the top wall enclosing the multiple cavities and a plurality of inlet and outlet ports formed in the top wall to provide air circulation within the multiple cavities.

7. The cage of claim 6 where the canopy inlet and outlet ports are arranged in a staggered orientation on the top wall so that adjacent outlet ports do not obstruct air flow into the adjacent inlet port.

8. The cage of claim 7 wherein an even number of inlet ports are arranged linearly across the top wall, each inlet port adjacent a first side wall and an odd number of outlet ports are arranged linearly across the top wall, each outlet port adjacent a second side wall.

9. The cage of claim 8 wherein four inlet ports and three outlet ports are arranged linearly in two rows across the top wall.

10. The cage of claim 1 wherein the outlet port includes a canopy protruding above the top wall and the canopy forming an opening to direct exhaust out of the interior cavity.

11. The cage of claim 10 wherein the canopy of the inlet port includes an opening facing in a direction opposite the opening provided by the canopy of the outlet port, so that a stream of air flowing in one direction can enter the inlet port and exits the outlet port.

12. The cage of claim 11 wherein the opening of the canopy of the inlet port is oriented to intercept a stream of air flowing parallel to the side walls.

13. The cage of claim 11 wherein the opening of the canopy of the inlet port is oriented to intercept a stream of air flowing perpendicular to the side walls.

14. The cage of claim 11 wherein the opening of the canopy of the inlet port is oriented to intercept a stream of air flowing oblique to the side walls.

15. The cage of claim 1 wherein the length between the inlet and outlet port is substantially equal to the width so that air entering the inlet port will travel over a substantial portion of the side of the electronic module mounted in the cavity prior to exiting the outlet port.

16. The cage of claim 1 wherein the air deflected by the canopy develops turbulence in order to cause air flow within the cavity on at least two sides of an electronic module residing in the cavity.

17. A housing for an electronic device comprising:

an enclosure having a first panel defining a plane and the enclosure orientable so that a stream of air flowing in a first direction flows along the plane and across the first panel;

an air inlet port disposed on the first panel; the inlet port including an air deflector protruding beyond the first panel for deflecting air flowing in the first direction into the enclosure; and an air outlet port disposed on the enclosure providing for the exhaust of the air received in the inlet port;

each of the ports disposed in the plane and including an opening and each opening oriented in an opposite direction to one another, so that a stream of air flowing in one direction can enter the inlet port, continue traveling in the first direction and exit the outlet port.

18. The housing of claim 17 where air the deflector is half dome shaped and is stamped from a metal planar first panel.

19. A metallic cage for receiving a plurality of transceiver modules in a plurality of cavities comprising:

a metallic enclosure having top, bottom, back and first and second side walls joined to form a ganged cage having at least two cavities for receiving at least two transceiver modules, each insertable along a longitudinal axis of each cavity the longitudinal axis is parallel to a first side wall and second side wall;

a plurality of air inlet and outlet ports, integrally formed in the top wall by stamping protruding air deflectors to form each port, the top wall defining a plane and the inlet and outlet ports disposed in the plane; and the air deflectors of the inlet ports having an opening defining a cross-sectional area oriented in a direction parallel to the longitudinal axis and the opening facing in a direction opposite to openings of the air deflectors of the corresponding outlet ports, for receiving air entering the inlet ports and flowing along at least one surface of a side of a transceiver module mountable in the cavity in order to cool the transceiver module and for exhaust air to exit the outlet ports; and the air inlet ports disposed in a row extending along the top wall adjacent the first wall and the air outlet ports disposed in a row extending along the top wall adjacent the second wall.

* * * * *